Figure 1:
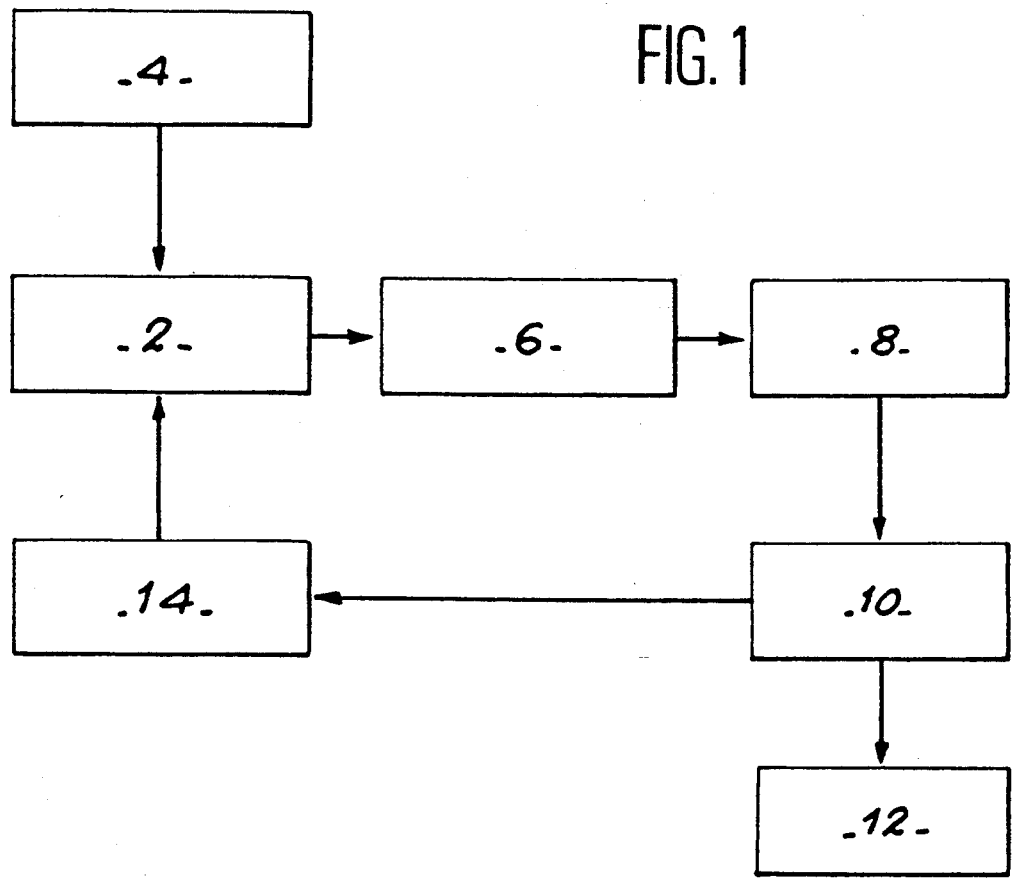

United States Patent [19]

Gidon et al.

[11] Patent Number: 5,079,689

[45] Date of Patent: Jan. 7, 1992

[54] PULSE-TYPE ELECTRIC SUPPLY FOR A LOAD EQUIPPED WITH MEANS FOR DIVERTING THE ELECTRIC POWER LIABLE TO BE REFLECTED BY THE LOAD

[75] Inventors: Serge Gidon, Tulette; Bernard Hennevin, Decines, both of France

[73] Assignee: Commissariat A L'Energie Atomique, France

[21] Appl. No.: 613,126

[22] Filed: Nov. 15, 1990

[30] Foreign Application Priority Data

Nov. 23, 1989 [FR] France ............................ 89 15421

[51] Int. Cl.[5] ............................................ H02M 7/537
[52] U.S. Cl. .................................... 363/131; 307/108; 328/66
[58] Field of Search ............... 372/38; 320/1; 307/106, 307/107, 108; 363/131, 56; 328/59, 66

[56] References Cited

U.S. PATENT DOCUMENTS

| | | | |
|---|---|---|---|
| 3,211,915 | 11/1965 | Poehlman et al. | 307/88 |
| 4,336,587 | 6/1982 | Boettcher, Jr. | 363/24 |
| 4,378,586 | 3/1983 | Bete | 363/56 |
| 4,405,889 | 9/1983 | Overstreet et al. | 320/1 |
| 4,549,091 | 10/1985 | Fahlen et al. | 307/106 |
| 4,607,322 | 8/1986 | Henderson | 363/24 |

FOREIGN PATENT DOCUMENTS 1439680  7/1965  France .
2575010  12/1984  France .
9108605  6/1991  France .

OTHER PUBLICATIONS

J. Phys. E: Sci. Instrum 21 (1988) pp. 388–392 Printed in the U.K. "Design and Performace of a 20 Watt Copper Vapour Laser" by: J. K. Mittal; P. K. Bhadani, B. Singh, L. Abhinandan and R. Bhatnagar.

J. Phys. E: Sci. Instrum 21 (1988) pp. 218–224 Printed in the U.K. "An Efficient Laser Pulser Using Ferrite Magnetic Switches" by: H. J. Baker, P. A. Ellsmore, E. C. Sille.

Primary Examiner—R. Skudy
Assistant Examiner—Adolf Berhane
Attorney, Agent, or Firm—Hayes, Soloway, Hennessey & Hage

[57] ABSTRACT

A pulse-type electric supply system for a load, equipped with means for diverting the electric power liable to be reflected by the load. The system includes an electric pulse generator (8) for supplying pulses to the load (12), a direct current electric supply (2,6) for the generator and a diverter (10) for diverting the electric power liable to be reflected by the load after the latter has received an electric pulse from the generator, so that the reflected electric power takes a different path from that followed by the pulse and which does not return directly to the generator. The system has particular application for use with metal vapour lasers.

11 Claims, 2 Drawing Sheets

PULSE-TYPE ELECTRIC SUPPLY FOR A LOAD EQUIPPED WITH MEANS FOR DIVERTING THE ELECTRIC POWER LIABLE TO BE REFLECTED BY THE LOAD

The present invention relates to a pulse-type electric supply system for a load. In more particularly applies to the pulse-type electric supply of a metal vapour laser, e.g. a copper vapour laser.

It is known that in a metal vapour laser and more particularly in a copper vapour laser, a population inversion is obtained by exciting the vapour by high instantaneous power electric discharges.

The energy of said discharges comes from a power pulse generator having electric power accumulation means (which themselves have a capacitor or a capacitor group) previously charged under a high voltage. These electric power accumulation means are associated with switching means via which they discharge into the laser. These switching means can be associated with a magnetic compression stage or stages making it possible to reduce the time width of the pulses reaching the laser.

A power pulse generator is described in the article by J. K. MITTAL et al entitled "Design and performance of a 20 watt copper vapour laser" and published in J. Phys. E: Sci. Instrum., 21, 1988, pp. 388-392 to which reference will be made. The generator described in this article has a thyratron as the switching means.

Other known generators have switching semiconductor devices (GTO-type thyristors or IGBT transistors).

In order to aid switching it is also known to combine with said semiconductor switching means saturatable magnetic elements (saturatable inductances). Reference should be made in this connection to the article by H. J. BAKER et al entitled "An efficient laser pulser using ferrite magnetic switches" and published in J. Phys. E. Sci. Instrum., 21, 1988, pp. 218-224.

The prior art power pulse generator and therefore the known pulse-type electric supply systems for the copper vapour lasers having said generators are subject to instability, which leads to fluctuations of the power of said pulses and therefore fluctuations in the power of the light pulses produced by the lasers.

These power fluctuations are due to the variation of the recharging voltage of the electric power accumulation means. This voltage variation is in turn due to fluctuations of the electric power absorbed by the laser associated with said accumulation means. This absorbed power is significantly dependent on the discharge conditions in the vapour of the laser.

The electric power reflected at the "head" of the laser (vapour, enclosure containing the latter and discharge electrodes in the vapour) is in the form of a variable voltage at the terminals of the electric power accumulation means and, during the following charging cycle, said voltage leads to the aforementioned fluctuations.

In the case of generators incorporating semiconductor switching devices associated with saturatable magnetic elements, these generators (and therefore the systems of which they form part) are also subject to instability which cause jitter, i.e. a time position instability of the electric pulses supplied to the laser. This jitter is inadmissible during the connection in series of several lasers functioning as amplifiers.

The object of the present invention is to obviate the instability disadvantages of known metal vapour laser supply systems and in particular copper vapour laser systems by solving the problem of the control of the electric power stored in the accumulation means of said systems.

More generally, the present invention aims at obviating the instability disadvantages of a pulse-type electric supply system for a load, whose impedance is not matched to said system and fluctuates over a period of time (which is the case with metal vapour lasers, whose matching would in fact be prejudicial to their performance characteristics) and which consequently reflects a time-fluctuating part of the electric power which it receives.

To obviate these disadvantages, the system according to the invention comprises means for diverting the electric power reflected by the load, so that said reflected power does not return to the electric pulse generator and consequently not to the electric power accumulation means of said generator.

More specifically, the present invention relates to a pulse-type electric supply system for a load incorporating an electric pulse generator for supplying said pulses to the load and direct current electric supply means for the generator, characterized in that it also comprises means for diverting the electric power liable to be reflected by the load after the latter has received an electric pulse from the generator, so that the reflected electric power takes a path different from that followed by said pulse and does not directly return to the generator.

The system according to the invention can also comprise auxiliary means for at least partly recovering the reflected and diverted electric power.

The direct current electric supply means can comprise a direct current voltage source and means for regulating said voltage supplying the generator and auxiliary means can also be provided for transferring the recovered electric power to the voltage source.

According to a special embodiment of the system according to the invention, the generator comprises first electric power accumulation means, which are charged with electric power by direct current electric supply means, first switching means, whose closure causes the discharge of the first electric power accumulation means and which are opened at the end of said discharge, a transformer incorporating a first coil connected to the first electric power accumulation means via first switching means and a second coil, as well as a third coil and second electric power accumulation means connected on the one hand to the second coil and on the other to the load, the first and second coils being coupled so as to permit the transfer of the electric power of the first accumulation means to the second accumulation means during the closure of the first switching means and the means for deflecting the reflected electric power incorporate the third coil, the latter serving to intercept, by coupling with the second coil, the reflected electric power accumulated in the second electric power accumulation means.

The auxiliary means can incorporate third electric power accumulation means connected to the third coil.

The auxiliary means also comprise second switching means via which the third accumulation means are connected to the voltage source.

The first and second switching means can be semiconductor switching devices.

Preferably, the generator also comprises magnetic compression means via which the load receives the electric pulse. These magnetic compression means can be connected on the one hand the second electric power accumulation means and on the other to the load.

Finally, said load can be a metal vapour laser.

The invention is described in greater detail hereinafter relative to non-limitative embodiments and the attached drawings, wherein show:

FIG. 1 an operating diagram for a system according to the invention.

Figure 2:
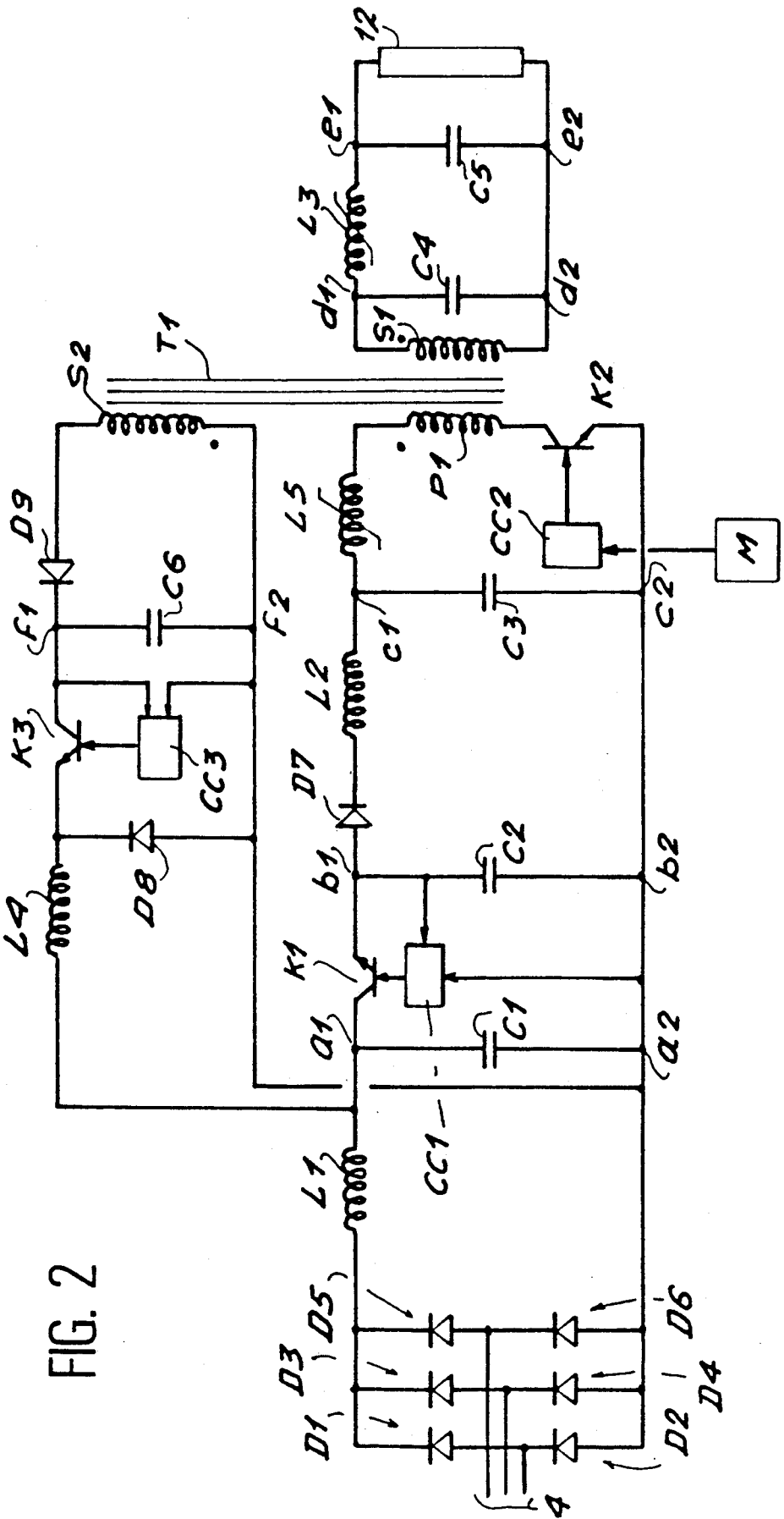

FIG. 2 an electric diagram of a particular embodiment of the system according to the invention.

Figure 3:
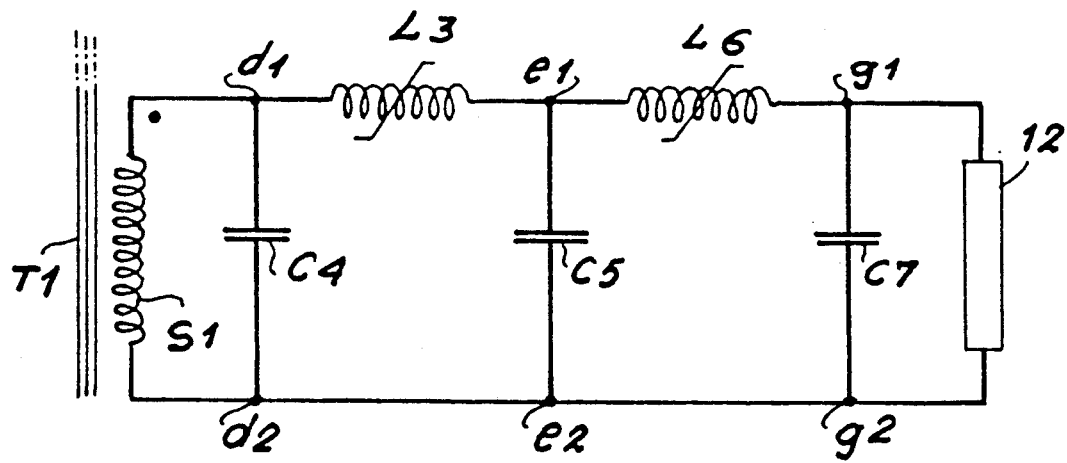

FIG. 3 a partial electric diagram of a variant of the system of FIG. 2.

The system according to the invention, whose operating diagram is shown in FIG. 1, successively comprises a d.c. voltage source 2, which is supplied by an electric power source 4, a regulator 6 for said voltage, a pulse generator 8 supplied by the regulator 6 and means 10 for diverting the electric power reflected by a mismatched load 12 to which the generator supplies electric pulses.

The system, whose diagram is shown in FIG. 1, also comprises means 14 for recovering the electric power reflected and diverted by the load 12, so as to supply said power to the voltage source 2.

Preferably, the recovery of the reflected power is controlled, i.e. preferably it is not totally recovered and instead only a predetermined quantity thereof is recovered (cf. hereinafter).

Thus, as soon as it appears, the reflected power is switched to a path differing from that followed by the incident power, so as to reach the recovery means 14 and whilst bypassing the voltage regulator 6 and the pulse generator 8, which enables the regulator 6 and the generator 8 to operate under satisfactory conditions without any disturbance.

Therefore the electric pulses supplied by the generator 8 are very stable as regards power and time position.

FIG. 2 shows an embodiment of the invention in the form of an electric circuit diagram showing the different components of the system of FIG. 1. In FIG. 2, the power source 4 is the three-phase mains and the load 12 is e.g. a copper vapour laser.

The d.c. voltage source 2 comprises six diodes D1 to D6, an inductance L1 and a capacitor C1. The cathodes of the diodes D2, D4 and D6 are respectively connected to the anodes of the diodes D1, D3 and D5, whose cathodes are connected to a terminal of the inductance L1. The other terminal of L1 is connected a terminal a1 of the capacitor C1, whose other terminal a2 is connected to the anodes of the diodes D2, D4 and D6. The three conductors of the three-phase mains 4 are respectively connected to the anodes of the diodes D1, D3 and D5. This gives a filtered, but not stabilized voltage source.

The thus obtained d.c. voltage is stabilized and its filtering improved by means of a transistor K1 and a capacitor C2 and the amplitude of said voltage is then doubled by means of an oscillating circuit incorporating an inductance L2 and a capacitor C3, which here constitutes the accumulation means for the electric power which it is wished to supply to the load 12.

The transistor K1 is e.g. a npn-type IGBT transistor. It is associated with a control card CC1, which controls the transistor K1 on an all or nothing basis and the capacitor C3 is associated with a transistor K2, which can also be a npn-type IGBT transistor and which also has a control card CC2.

The card CC1 has two inputs constituting together a differential input and which are respectively connected to the terminals b1 and b2 of C2. The card CC1 also has an output, which controls the base of the transistor K1.

The terminal a1 of C1 is also connected to the collector of K1 and the terminal a2 of C1 is also connected to the terminal b2 of C2.

The other terminal b1 of C2 is connected to the emitter of K1, as well as to the anode of a diode D7, whose cathode is connected to one of the terminals of the inductance L2. The other terminal of L2 is connected to a terminal c1 of C3, whose other terminal c2 is connected to b2.

The card CC2 has an input, which is connected to means M constituting the clock of the system and making it possible to control, via CC2, the opening and closing of the switch constituted by the transistor K2 as a function of the charging-discharging requirements of the capacitor C3, the card CC2 also having an output controlling the base of the transistor K2. The emitter of the latter is connected to the terminal c2 of the capacitor C3.

In the case of FIG. 2, the voltage regulator 6 comprises the switch or transistor K1 and the capacitor C2 and the pulse generator 8 comprising the switch K2, the capacitor C3 and coils P1, S1 of a transformer, a saturatable inductance L3 and capacitors C4 and C5 to which reference will be made hereinafter.

The inductance L2 has a separating function between the voltage regulator 6 and the pulse generator 8. The diode D7 permits a good electric power transfer from C2 to C3, whilst preventing said power from returning to C2.

The system shown in FIG. 2 also comprises a transformer T1 with three coils or windings P1, S1 and S2. One terminal of the coil P1 is connected to the collector of the transistor K2 and its other terminal is connected to the terminal c1 of the capacitor C3 across a saturatable inductance L5. The latter aids switching.

The coil P1 serves as a primary, whereas the coil S1 serves as a secondary.

The terminals of S1 are respectively connected to the terminals d1 and d2 of a capacitor C4. The terminals e1 and e2 of another capacitor C5 are respectively connected to the electrodes of the laser 12. Moreover, the terminals d2 and e2 are interconnected and the terminals d1 is connected to the terminal e1 across a saturatable inductance L3.

The coil S2 serves as a secondary with respect to S1. One terminal of S2 is connected to the anode of a diode D9, whose cathode is connected to a terminal f1 of a capacitor C6. The other capacitor f2 of said capacitor C6 is connected to the other terminal of S2.

In the case of FIG. 2, the means 10 for diverting or switching the power reflected by the laser 12 incorporate the coil S2 and the diode D9. The recover and control of said reflected power are obtained by means of a transistor K3, a diode D8 serving as a freewheeling diode, as well as an inductance L4.

The transistor K3 is e.g. an npn-type IGBT transistor. It is equipped with a control card CC3, which controls said transistor on an all or nothing basis. This card has two inputs together forming a differential input and which are respectively connected to the terminals f1 and f2 of C6.

The card CC3 also has an output controlling the base of the transistor K3. The collector of the latter is connected to the terminal f1 of C6 and the emitter of the transistor K3 is connected to the cathode of the diode D8, whose anode is connected to the terminal f2 of C6.

Moreover, the cathode of the diode D8 is connected to a terminal of the inductance L4, whose other terminal is connected to the terminal a1 of the capacitor C1 and the anode of the diode D8 is also connected to the terminal a2 of said capacitor C1.

Information will be given hereinafter on the operation of the system shown in FIG. 2.

When a trigger pulse from the means M brings about the closure of switch K2, the capacitor C3 transfers the power to the capacitor C4 by oscillation of the stray inductance of the primary coil P1 with respect to the secondary coil S1 of the transformer T1. At the end of the transfer, i.e. as soon as the current across the transistor K2 is cancelled out, the means M control the opening of the switch constituted by said transistor K2.

All the circuits between K1 and the primary P1 are then isolated from the circuits downstream of P1 and are consequently not disturbed by the behaviour of said circuits located downstream of P1. The power of C4 is then transferred to the laser 12 across the magnetic compression stage formed by the capacitor C5 and by the saturatable inductance L3.

The power reflected by the laser 12 charges the capacitor C4 with a polarity which is the reverse of that of the initial polarity. This reflected power is then transferred to the capacitor C6 by oscillation of the stray inductance of S1 with respect to S2. The reflected power remains stored in the capacitor C6 up to the closure of the switch constituted by K3 enabling the transfer of the power stored in C6 to C1 by oscillation with the inductance L4.

The control card CC3 of K3 measures the voltage at the terminals of C6 and is provided with a regulatable threshold such that if said voltage exceeds said threshold, the card CC3 controls the closure of K3. It is therefore possible to regulate the threshold in such a way as to entirely recover the power reflected by the laser.

However, the threshold can be regulated in such a way as to only permit the passage of a predetermined part of the reflected power stored in C4 in order to allow a subsequent complete demagnetization of L3. This is brought about by causing the opening of K3 prior to the power stored in C6 having been totally transferred to C1.

The system described with reference to FIG. 2 makes it possible to reduce the jitter of the pulses supplied to the laser 12, because the voltage to which C3 is charged in kept constant between individual triggerings of K2 and the magnetic rest state of L3 is made independant of the behaviour of the load, i.e. of laser 12.

As is indicated by the dots in FIG. 2, the respective directions of the coils P1, S1 and S2 are such that the corresponding inductions are in the same direction.

The cards CC1 and CC3 are of the type used in cutoff electric supplies for controlling the power transistors of such supplies. The card CC2 ensures the shaping of the signals from means M in order to control the transistor K2 on an all or nothing basis.

It was stated hereinbefore that K1, K2 and K3 could be IGBT transistors. However, anyone of these transistors could be replaced by some other appropriate switch, such as a GTO thyristor, whose anode, cathode and gate would be respectively connected in the same way as the collector, emitter and base of said transistor.

In a variant, use is made of a plurality instead of one magnetic compression stage. For example to stage L3, C5 would be added a supplementary magnetic compression stage having a saturatable inductance L6 (FIG. 3) and a capacitor C7. The laser 12 is in this case fitted between the terminals g1 and g2 of C7, the terminal g2 is connected to the terminal e2 of C5 and the terminal g1 is connected to the terminal e1 of C5 via the saturatable inductance L6.

We claim:

1. Pulse-type electric supply system for a load comprising an electric pulse generator for supplying pulses to the load, an electric supply means for supplying direct current to the generator, and means for diverting the electric power liable to be reflected by the load after the latter has received an electric pulse from the generator, so that the reflected electric power takes a path different from that followed by said pulse and does not directly return to the generator.

2. System according to claim 1, and further comprising auxiliary means for the at least partial recovery of the reflected and diverted electric power.

3. System according to claim 2, wherein the direct current electric supply means comprise a d.c. voltage source and means for regulating said voltage, said means for regulating said voltage supplying the generator, and wherein the auxiliary means also is adapted to permit transfer of the recovered electric power to the voltage source.

4. System according to claim 1, wherein the generator comprises a first electric power accumulation means which are charged with electric power by said direct current electric supply means, a first switching means whose closure causes the discharge of the first electric power accumulation means and which are opened at the end of said discharge, a transformer incorporating a first coil connected to the first electric power accumulation means via said first switching means and a second coil, as well as a third coil and second electric power accumulation means connected on the one hand to the second coil and on the other hand to the load, the first and second coils being coupled so as to permit the transfer of the electric power of the first accumulation means to the second accumulation means during the closure of the first switching means and wherein the means for diverting the reflected electric power incorporate the third coil, the latter serving to intercept, by coupling with the second coil, the reflected electric power accumulated in the second electric power accumulation means.

5. System according to claim 4, and further comprising auxiliary means for the at least partial recovery of the reflected and diverted electric power, said auxiliary means incorporating third electric power accumulation means connected to the third coil.

6. System according to claim 5, wherein the direct current electric supply means comprise a d.c. voltage source and means for regulating said voltage supplying the generator; the auxiliary means are also provided for transferring the recovered electric power to the voltage source; and the auxiliary means also incorporate second switching means through which the third accumulation means are connected to the voltage source.

7. System according to claim 4, characterized in that the first switching means comprise a semiconductor switching device.

8. System according to claim 1, wherein the generator also comprises magnetic compression means through which the load receives the electric pulse.

9. System according to claim 4, wherein the generator also comprises magnetic compression means connected on the one hand to the second electric power accumulation means and on the other to the load and through which said load receives the electric pulse.

10. System according to claim 1, wherein the load comprises a metal vapour laser.

11. A system according to claim 6, wherein the second switching means comprise a semiconductor switching device.

* * * * *